(12) United States Patent
Devaux (10) Patent No.: US 12,400,700 B2
(45) Date of Patent: Aug. 26, 2025

(54) MEMORY DEVICE PROVIDED WITH DRAM MEMORY CIRCUITS ARRANGED IN SUCH A WAY AS TO MINIMIZE THE SIZE OF A MEMORY BLOCK ALLOWING MANAGEMENT OF THE ROW-HAMMERING

(71) Applicant: UPMEM, Grenoble (FR)

(72) Inventor: Fabrice Devaux, Lausanne (CH)

(73) Assignee: UPMEM, Grenoble (FR)

( * ) Notice: Subject to any disclaimer, the term of this patent is extended or adjusted under 35 U.S.C. 154(b) by 122 days.

(21) Appl. No.: 18/277,961

(22) PCT Filed: Feb. 11, 2022

(86) PCT No.: PCT/FR2022/050256
§ 371 (c)(1),
(2) Date: Aug. 18, 2023

(87) PCT Pub. No.: WO2022/175619
PCT Pub. Date: Aug. 25, 2022

(65) Prior Publication Data
US 2024/0135981 A1  Apr. 25, 2024
US 2024/0233800 A9  Jul. 11, 2024

(30) Foreign Application Priority Data
Feb. 22, 2021 (FR) ..................... 2101677

(51) Int. Cl.
*G11C 11/406* (2006.01)

(52) U.S. Cl.
CPC .. *G11C 11/40615* (2013.01); *G11C 11/40618* (2013.01); *G11C 11/40622* (2013.01)

(58) Field of Classification Search
CPC ........ G11C 11/40615; G11C 11/40618; G11C 11/40622
See application file for complete search history.

(56) References Cited

U.S. PATENT DOCUMENTS 10,431,281 B1 * 10/2019 Fackenthal ......... G11C 11/2293
10,885,966 B1 *  1/2021 Devaux ................ G11C 11/408
10,908,846 B2 *  2/2021 Lee ....................... G11C 11/408
11,361,811 B2 *  6/2022 Devaux ............... G11C 11/4078
(Continued)

OTHER PUBLICATIONS

International Search Report for PCT/FR2022/050256, May 30, 2022, 2 pages.
(Continued)

*Primary Examiner* — Min Huang
(74) *Attorney, Agent, or Firm* — BKRIP LLC (57) ABSTRACT

The invention relates to a memory device comprising: —DRAM memory circuits (100), the total capacity of which is divided into a first part (102) and a second part (103) larger than the first part (102); —a control circuit configured to access the memory circuits, the control circuit comprising: —a first block (201) configured to execute a first algorithm (201A) intended to protect the first part (102) from a row-hammering effect; —a second block (202) configured to execute a second algorithm (202A) intended to protect the second part (103) from a row-hammering effect that may occur, the second algorithm (202A) using a main table stored in the first part (102).

17 Claims, 4 Drawing Sheets

(56) References Cited

U.S. PATENT DOCUMENTS

2019/0006001 A1\* 1/2019 Chun .................... G06F 11/073
2020/0218469 A1   7/2020 Lee
2021/0257039 A1\* 8/2021 Prakash ............. G11C 16/3427
2023/0154521 A1\* 5/2023 Kim .................. G11C 11/40618
                                                      365/222

OTHER PUBLICATIONS

International Written Opinion for PCT/FR2022/050256, May 30, 2022, 3 pagess.
Seyedzadeh Seyed Mohammad et al, "Mitigating Wordline Crosstalk Using Adaptive Trees of Counters", 2018 ACM/IEEE 45th Annual International Symposium On Computer Architecture (ISCA), IEEE,Jun. 1, 2018 (Jun. 1, 2018), p. 612-623, XP033375523.

\* cited by examiner

Fig. 1

MEMORY DEVICE PROVIDED WITH DRAM MEMORY CIRCUITS ARRANGED IN SUCH A WAY AS TO MINIMIZE THE SIZE OF A MEMORY BLOCK ALLOWING MANAGEMENT OF THE ROW-HAMMERING

FIELD OF THE INVENTION

The present invention relates to the field of memories, and in particular to the field of dynamic random access memories.

In particular, the present invention relates to the management of the memory row-hammering effect.

In this respect, the present invention proposes an architecture of a memory device making it possible to manage and prevent the memory row-hammering effect for large-capacity memory devices without penalizing the performance of said devices.

TECHNOLOGICAL BACKGROUND OF THE INVENTION

The row-hammering effect in the Dynamic Random Access Memories ("DRAM") is well known to the person skilled in the art.

This effect has its origin in the repeated activation of a row of a bank of a DRAM. More particularly, when the number of activations of a given row, called the "aggressor row", exceeds a critical hammering value, the rows which are immediately adjacent to it, called the "victim rows", see some of their bits inverted.

In order to prevent the row-hammering effect, it may be envisaged, before a row becomes an aggressor, to refresh the two adjacent victim rows according to a preventive refresh procedure.

Such a preventive refresh procedure is, in this respect, described in document FR 3066842. This document in particular discloses a memory device provided with a logic for detecting the triggering of row hammer. This detection logic is configured to monitor and/or count the number of activations of each row of a bank or of a sub-bank of the memory device. The counting data are, in this respect, stored in one or more tables whose number of entries is directly dependent on the size of the memory device (and in particular its capacity).

This memory device known from the prior art is particularly efficient as long as the critical hammering value remains greater than 40,000.

However, the increasing capacity of memory devices requires the consideration of tables comprising a greater number of entries, and which consequently consume much more resources.

Moreover, considering only row hammering at the rows immediately adjacent to the aggressor row, as proposed in document FR 3066842, reaches its limits when the memory device is manufactured according to fine geometries, and in particular at scales smaller than 20 nm.

Indeed, the consideration of finer patterns or geometries inevitably leads to increasing the scope of the row-hammering effect. In particular, an aggressor row of index "i" of a bank or of a sub-bank of memory will not only affect the rows that are immediately adjacent to it (with indices "i−1" and "i+1"), but also, and to a lesser extent, the rows with indices "i−k" and "i+k" (where "k" is an integer strictly greater than 1).

Increasing the scope of the hammering effect thus has two consequences. Firstly, it contributes to increasing the size of tables that can be considered in document FR 3066842. Secondly, it imposes critical hammering values much lower than 40,000, or even lower than 4800.

These two combined effects directly affect the effectiveness of the logic proposed in this document for detecting the triggering of row hammer.

In order to overcome these problems, another algorithm for preventing the row-hammering effect has been proposed in document U.S. Pat. No. 10,885,966. That document also implements tables, and considers a scope of the hammering effect beyond the rows immediately adjacent to an aggressor row. More particularly, the proposed algorithm, in order to limit the resources necessary for its implementation, monitors the activations at the level of sub-banks.

This algorithm, even more efficient than that proposed in document FR 3066842, can be improved for certain memory device architectures.

In particular, this algorithm is generally implemented by means of a Static Random Access Memory ("SRAM") block. However, an increased memory device capacity, and a small size of the geometries used, increases the size of the tables necessary for the proper execution of the algorithm for preventing the row-hammering effect.

These factors therefore make it necessary to consider SRAM memory blocks of greater capacity. However, this type of memory consumes space, and is capable of significantly increasing the total cost of the memory system.

OBJECT OF THE INVENTION

One aim of the present invention is to propose a memory device implementing an algorithm for preventing the row-hammering effect and for which the SRAM memory block has a limited size.

DISCLOSURE OF THE INVENTION

The present invention relates to a memory device and, more particularly, to a memory device whose architecture makes it possible to effectively manage the row-hammering effect when the density of said memory device and its total capacity increase.

The memory device comprises memory circuits, of the "DRAM" type, the total capacity of which is divided into a first part, called the "directly protected part", and a second part, called the "indirectly protected part", larger than the first part.

According to the present invention, the memory device comprises a control circuit which implements two protection algorithms called, respectively, first algorithm and second algorithm.

More particularly, the control circuit comprises a first block implementing the first algorithm and a second block implementing the second algorithm.

In this respect, the first algorithm is configured to protect the first part from the row-hammering effect.

The second algorithm, for its part, is configured to protect the second part from the row-hammering effect. It particularly implements at least one table saved in the first part, this table being called a main table.

The aim of the invention is achieved by a memory device comprising:

memory circuits, these circuits comprising memories of the "DRAM" type, the total capacity of which is divided into a first part, called the "directly protected part", and a second part, called the "indirectly protected part", larger than the first part;

a control circuit configured to access the memory circuits, the control circuit comprises:

a first block configured to execute a first algorithm intended to protect the first part from a row-hammering effect;

a second block configured to execute a second algorithm intended to protect the second part from a row-hammering effect that may occur, the second algorithm using a main table stored in the first part;

According to one embodiment, the control circuit comprises a functional block configured to execute computing functions and programs in the second part, and advantageously also in the first part.

According to one embodiment, the first part and the second part are arranged so that the row-hammering effect imposed by one row of either the first part or the second part is not felt by the other of the first part or of the second part.

According to one embodiment, the first part and the second part are configured according to one of the following configurations:

the first part and the second part are disjoint so as not to share DRAM memory circuits;

the first part and the second part each comprise banks of DRAM memory circuits specific to them;

the first part and the second part, within the same bank of DRAM memory circuits, each comprise one or more sub-banks that are specific to them, said sub-banks are then arranged so that the row-hammering exerted by a row of a sub-bank of the first part is not felt by a sub-bank of the second part and vice versa;

the first part and the second part have in common a DRAM memory circuit bank, called a common bank, said common bank comprising unused memory rows and separating a section of the common bank, associated with the first part, from another section of the common bank, associated with the second part, the number of unused memory rows being chosen so that no row-hammering effect occurs between each of the two sections of the common bank.

According to one embodiment, the size of the first part corresponds to less than 0.1% of the size of the second part.

According to one embodiment, the first part and the second part are capable of exerting a row-hammering effect on one another, and wherein the first algorithm and the second algorithm are configured to prevent the row-hammering effect by the first part against the second part and vice versa.

According to one embodiment, the second block comprises a cache memory intended to store data of the main table used by the second algorithm.

According to one embodiment, the first block uses a table called the initial table, this initial table being implemented by the first algorithm, and stored in a memory called a protection memory block.

According to one embodiment, the first algorithm is a probabilistic algorithm that does not require an initial table. The document "Flipping Bits in Memory Without Accessing Them: An Experimental Study of DRAM Disturbance Errors" discloses, for example, the "PARA" algorithm (Probabilistic Adjacent Row Activation), representative of probabilistic algorithms that do not require any table.

According to one embodiment, the first block comprises a cache memory intended to store data from the initial table used by the first algorithm and located in the protection memory block, the use of such a cache being advantageous when the performance of the protection memory block is limited.

According to one embodiment, the protection memory block comprises a memory immune to the row-hammering effect, in particular said memory may, in a non-limiting example, be a SRAM, MRAM or CNRAM memory.

According to one embodiment, the protection memory block comprises a DRAM memory, and wherein the memory rows are arranged so as to prevent any row-hammering within said block.

According to one embodiment, the protection memory block comprises a DRAM memory, and wherein the refresh rate is increased so as to prevent any row-hammering within said block.

According to one embodiment, the protection memory block comprises a DRAM memory, and wherein electrical shields separate the rows so as to prevent any row-hammering within said block.

According to one embodiment, the protection memory block comprises a DRAM memory, and wherein unused rows separate the used rows so as to prevent any row-hammering within said block.

According to one embodiment, the protection memory block comprises a DRAM memory using a technically feasible combination of the 4 preceding methods so as to prevent any row-hammering within said block.

According to one embodiment, the DRAM memory comprises a third part and a third block implements a third algorithm for preventing the row-hammering effect using the second part to implement the table(s) that it requires.

According to one embodiment, an initial table is used by the first algorithm and the corresponding protection memory block is a DRAM memory protected from the hammering effect according to the present invention.

The invention also relates to a DRAM memory controller, the controller being intended to configure a protection of said DRAM memories against a memory row-hammering effect, the protection involving the implementation of a control circuit and a protection memory block having a predetermined capacity, the controller being adapted to:

determine the total capacity of the DRAM memories controlled by the controller;

if the total capacity of the DRAM memories exceeds a size, referred to as the threshold size, beyond which the protection by an algorithm implementing a single table saved in the protection memory block is impossible, the controller divides the total capacity of the DRAM memories into N parts, each part i, for i ranging from 1 to N, N and i being integer values, and configures the control circuit so that it can execute N row-hammering effect protection algorithms each referred to as algorithm i, for i ranging from 1 to N, each algorithm i being intended to protect the part i from the row-hammering effect by means of a table i, each table i, for i ranging from 2 to N, being saved in part i−1, while table 1 is saved in the protection memory block, if the total capacity of the DRAM does not exceed the threshold size, the controller configures the control circuit so that it protects said DRAM memories by means of a single algorithm that implements a table stored in the protection memory block.

According to one embodiment, the capacity of the parts i increases, for i ranging from 1 to N.

According to one embodiment, the protection memory block comprises a memory immune to the memory row-hammering effect, advantageously the protection memory block comprises at least one of the memories chosen from: an SRAM memory, an MRAM memory, or a CNRAM memory.

According to one embodiment, the protection memory block is included in the controller.

According to one embodiment, the protection memory block comprises memory DRAM, advantageously, the protection memory block forms a part 0 of the DRAM memories.

According to one embodiment, the control circuit is included in the controller.

BRIEF DESCRIPTION OF THE DRAWINGS

Other features and advantages will become apparent in the following description of a memory device according to the invention, given by way of non-limiting examples, with reference to the appended figure, wherein.

DETAILED DESCRIPTION OF THE INVENTION

The present invention relates to a memory device provided with means for protecting from the row-hammering effect. In particular, the present invention proposes a memory device whose architecture is optimized to prevent the row-hammering of the memory circuits.

Figure 1:
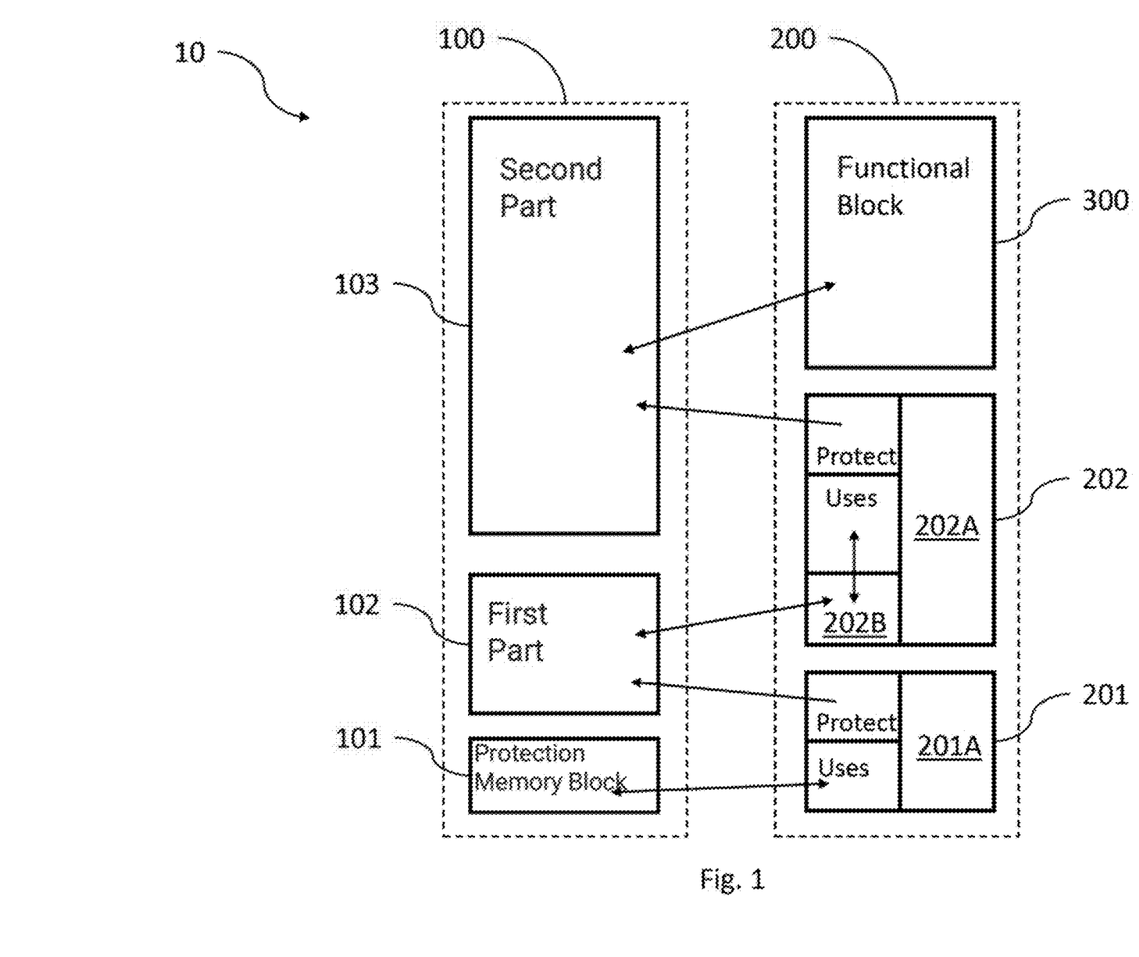
FIG. 1 is an illustration of the architecture of a memory device established according to the principles of the present invention, in particular the memory device comprises a memory part and a control circuit configured to prevent the row-hammering effect in the memory part, the memory part is, in turn, subdivided in order to optimize the management of the row hammering, the single and double arrows illustrate the direction of the interactions between the various parts of the memory device.

FIG. 1 shows a first example of a memory device 10 according to the present invention.

The memory device comprises a memory part 100 and a control circuit 200.

The memory part 100 comprises in particular "DRAM" memory circuits. More particularly, the "DRAM" memory circuits have a total capacity divided into a first part called the "directly protected part 102" and a second part called the "indirectly protected part 103".

In accordance with the present invention, the first part 102 has a lower capacity, and more particularly much lower, than the second part 103.

"Much lower" can in particular be understood to mean a first part 102 whose capacity is less than 0.1% of the capacity of the second part 103.

Thus, the first part 102 may comprise 100 memory rows, while the second part 103 has 100,000.

The second part 103 may comprise one bank or a plurality of memory banks. The bank or memory banks can be divided into sub-banks. For example, a memory bank may comprise R rows and be divided into N sub-banks of identical sizes, or identical to within 1 row. In this case, the number of rows S or S+1 of a sub-bank is equal to the integer division of R by N.

The memory part 100 comprises a protection memory block 101. A protection memory block 101 as considered in the prior art comprises a memory circuit of the "SRAM" type. However, it will appear clearly in the rest of the description, and in accordance with the general principles of the present invention, that this protection memory block may also comprise a memory circuit of the "SRAM" type as a memory circuit of the "DRAM" type.

The control circuit 200 comprises a first block 201 and a second block 202 configured to protect from a row-hammering effect, respectively, the first part 102 and the second part 103.

The control circuit 200 may also comprise a functional block 300 configured to execute computing functions and programs in the second part 103, and advantageously also in the first part 102.

"Protecting from a row-hammering effect" means executing an algorithm, implemented according to a non-limiting example by a finite state machine, and which can be intended to command the execution of preventative refreshes of the memory rows. This algorithm, still according to a non-limiting example, can implement a monitoring of a number of activations of the rows of a bank or of a sub-bank, and can trigger, as soon as the number of activations exceeds a predetermined threshold, one or more preventative refreshes based on this monitoring.

Methods for protecting from row-hammering are described in documents FR 3066842 and U.S. Pat. No. 10,885,966. They can advantageously be implemented in the memory device according to the present invention. However, it is understood, without it being necessary to specify it, that the invention is not limited to their implementation alone.

The first block 201, as defined above, protects the row of the first part 102 from row-hammering.

To this end, the first block 201 is configured to execute a first algorithm 201A intended to protect the first part 102 from the row-hammering effect.

In particular, the first algorithm 201A, like the methods proposed in documents FR 3066842 and U.S. Pat. No. 10,885,966, can implement a table called the initial table.

The number of entries of this initial table is, moreover, a function of the size (or the capacity) of the first part 102. More particularly, a decrease in the capacity of the first part leads to a decrease in the number of entries of the initial table.

According to the present invention, the initial table is saved in the protection memory block 101. The initial table is implemented by the first algorithm 201A. The first algorithm 201A may in particular, and according to a non-limiting example, record the number of activations undergone by the rows of the first part 102 either on the scale of the row or on the scale of the bank or sub-bank. Based on this tracking, and on a criterion relating to the number of activations, the first algorithm 201A may command a (preventive) refresh in the first part 102.

The second block 202, as defined above, protects the row of the second part 103 from row-hammering.

In particular, the second algorithm 202A can implement a table called a main table.

To this end, the second block 202 is configured to execute a second 30 algorithm 202A intended to protect the second part 103 from the row-hammering effect.

The number of entries of this main table is, moreover, a function of the size (or the capacity) of the second part 103.

According to the present invention, the main table is saved in the directly protected part 102. The initial table is implemented by the second algorithm 202A. The second algorithm may in particular, and according to a non-limiting example, record the number of activations undergone by rows of the second part 103 either on the scale of the row or on the scale of the bank or sub-bank. Based on this tracking, and on a criterion relating to the number of activations, the second algorithm 202A may command a (preventive) refresh in the second part 103.

The relatively reduced size of the first part 102, made of DRAM, may optionally give it access performance much higher than that of the second part 103 and optionally simplify the execution of the algorithm 202A Furthermore, such an architecture, considering a first part of relatively small size, also limits the size (and the capacity) of the protection memory block 101, which generally implements SRAM memory that is very space-consuming and expensive to manufacture. The reduction in the size of the first part therefore opens the path to the consideration of an SRAM memory that is also of small size.

The functional block 300 mentioned above is intended to execute computing functions and programs capable of accessing the second part 103.

According to a particularly advantageous embodiment, the functional block 300 is also intended to execute computing functions and programs capable of accessing the first part 102. In particular, and by way of non-limiting example, these programs can be executed for reasons of initial or periodic hardware integrity tests, collecting statistics, computer attacks, development, or managing hardware failures.

In a particularly advantageous manner, the first part 102 and the second part 103 are arranged so that the row-hammering effect imposed by one row of either the first part 102 or the second part 103 is not felt by the other of the first part 102 or second part 103.

Such an objective may, for example, be achieved by imposing at least one of the following conditions:
1) It may be considered a first part 102 and a second part 103 that do not share DRAM circuits, and generally that are disconnected;
2) The first part 102 and the second part 103 may each comprise memory banks specific to them (the row-hammering effect is not carried out from one bank to the other);
3) The first part 102 and the second part 103, within the same memory bank, each comprise one or more sub-banks that are specific to them, said sub-banks are then arranged so that the row-hammering effect exerted by a row of a sub-bank of the first part is not felt by a sub-bank of the second part and vice versa;
4) The first part 102 and the second part 103 have in common a DRAM memory circuit bank, called a common bank, said common bank comprising unused memory rows and separating a section of the common bank, associated with the first part 102, from another section of the common bank, associated with the second part 103, the number of unused memory rows being chosen so that no row-hammering effect occurs between each of the two sections of the common bank.

The conditions cited above are only examples and must not be considered limiting in nature with regard to the present invention.

Alternatively, it may be assumed that the first part 102 and the second part 103 are capable of exerting a row-hammering effect on one another. In this case, this effect can be provided, and therefore managed, by the first algorithm 201A and the second algorithm 202A.

In particular, the first algorithm 201A may be configured to take into account the activation of the rows of the second part 103 likely to exert row-hammering on the rows of the first part 102.

Likewise, the second algorithm 202A may be configured to take into account the activation of the rows of the first part 102 likely to exert row-hammering on the rows of the second part 103.

Particularly advantageously, the second block 202 may comprise a cache memory 202B.

This cache memory 202B may in particular be implemented to temporarily store data relating to the main table.

In particular, this temporary storage may relate to entries of the main table for which recurring access is observed.

This consideration thus makes it possible to optimize, or more particularly, to minimize access to the main table located in the first part 102 of the memory.

Particularly advantageously, the first algorithm 201A and the second algorithm 202A can operate according to similar principles and criteria.

In particular, the first algorithm 201A and the second algorithm 202A implement the same hardware execution resources, and only differ in their sizing and the possible implementation of a cache memory.

This similarity between the first algorithm 201A and the second algorithm 202A makes it possible to consider carrying them out within the same hardware block.

It is finally notable that another cache memory can also be implemented for the execution of the first algorithm 201A.

This other cache memory is in particular implemented under conditions similar to those of the cache memory 202B.

The protection memory block 101 may comprise a memory immune to the row-hammering effect. In particular, the protection memory block 101 may comprise at least one of the memories chosen from: an SRAM memory, an MRAM ("magnetoresistive random-access memory"), a CNRAM memory ("carbon nanotube random-access memory").

However, the protection memory block 101, due to its small size, may comprise DRAM memory, if it is arranged or refreshed in such a way that it is immune to the row-hammering effect.

Optimized Architecture of the Memory Device of the Present Invention for Producing a DRAM Circuit.

The memory device 10 according to the present invention can therefore be a DRAM circuit that comprises the first part 102 and the second part 103. In other words, the DRAM circuit physically comprises the first and the second part and is configured to perform access independently on one and/or the other of these two parts.

The DRAM circuit also comprises the protection memory block 101 implemented in combination with the first algorithm for protecting the first part 102.

As stated above, the protection memory block 101 is dimensioned as a function of the size (or capacity) of the first part 102. To the extent that the first part 102 is of small size, it is therefore possible to also limit the size of the protection memory block 101.

These sizing effects are particularly advantageous in the context of the present invention. Indeed, due to its small size, the first part 102 of the DRAM circuit may have access performance much greater than the second part 103, optionally making it possible to simplify the execution of the second algorithm 202A.

The architecture of the DRAM circuit is also adapted so that the first algorithm 201A and the second algorithm 202A are executed in a background task and consequently do not disturb the normal operation of the DRAM circuit.

In particular, only the preventive refresh operations determined by the second algorithm must be inserted into the command traffic to the second part of the DRAM memory.

To this end, and in a non-limiting manner, it may be considered to transform periodic refresh commands, to the second part 103, during preventive refresh, in particular by imposing at least one of the following conditions:

an acceptable elongation of the period of the periodic refreshes, due to the fact that certain periodic refreshes are delayed since their execution time slots have been pre-empted to perform preventative refreshes.

the presence of an internal refresh simultaneity: each periodic refresh command resulting in the refreshing of several rows instead of only one, it is then possible to transform a significant fraction of the periodic refresh commands during preventive refresh.

Particularly advantageously, the present invention makes it possible to consider a protection memory block 101 made, due to its small size, from DRAM memory instead of SRAM memory.

A small DRAM memory may be configured to be immunized with row-hammering effects.

Such an objective may, for example, be achieved by imposing at least one of the following conditions:

implementing a shield between the rows of the DRAM memory;

implementing a much more frequent periodic refresh of the DRAM memory;

the use of only certain rows, the rows used being separated from each other by a sufficient number of unused rows;

grouping multiple memory points into a single memory point the local use of finer layouts of transistors and connections.

Finally, the person skilled in the art will understand that the memory device as described above is not limited to merely consideration of a first part, of a second part, and of a protection memory block.

Indeed, the principle of the invention can be generalized to a larger number of levels. In particular, the "DRAM" memory circuits can be divided into N parts, the control circuit may for its part implement N algorithms. More particularly, according to this configuration, the algorithm i implements the part i−1, (2≤i≤N) and protects the part i, while the part 1 is protected by the algorithm 1 and the protection memory block. The protection memory block may comprise, as desired, an SRAM memory or a DRAM part specifically designed to be immune to the row-hammering effect.

Figure 2:
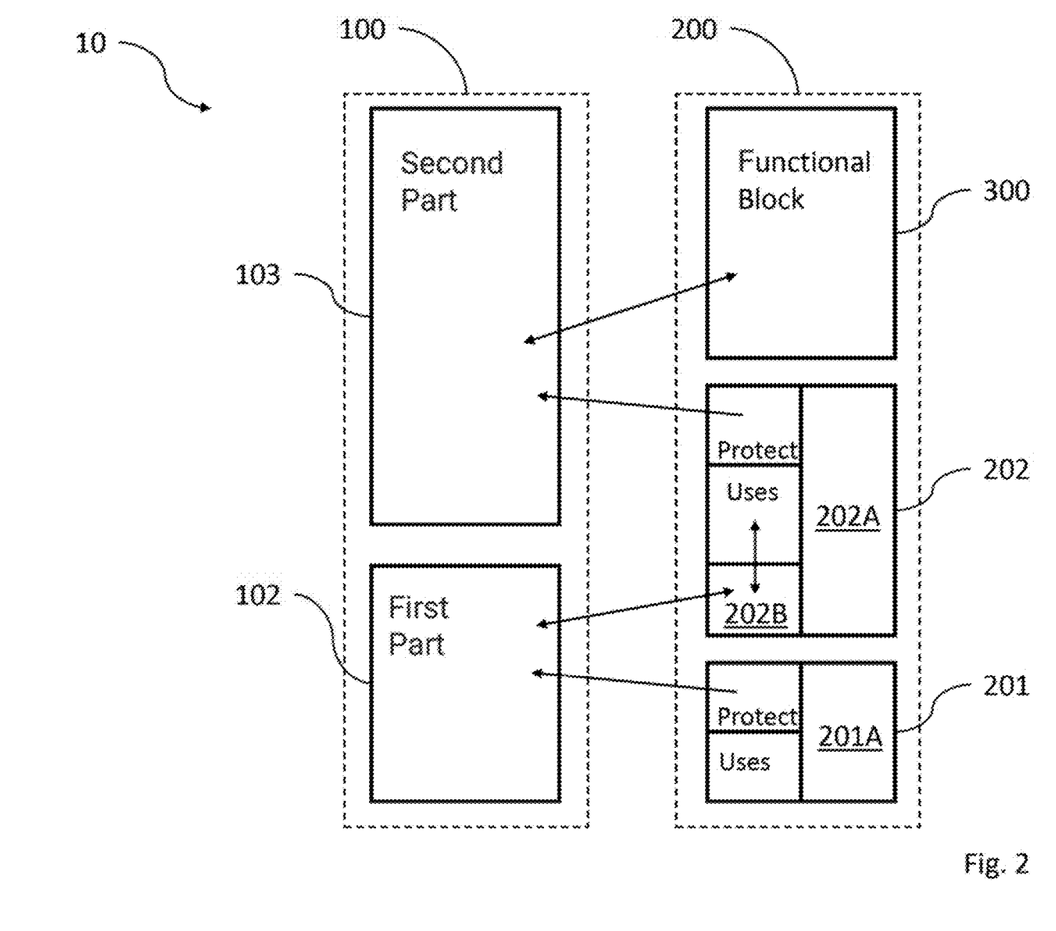
FIG. 2 is an illustration of another architecture of a memory device established according to the principles of the present invention, the device of FIG. 2 differing from that of FIG. 1 in that it does not comprise a protection memory block.

FIG. 2 shows a second example of a memory device 10 according to the present invention.

This second example largely repeats the set of features relating to the first example shown in FIG. 1.

However, in this second example, the memory device lacks a protection memory block 101, and therefore does not implement a first table as described in the first example.

Thus, according to this configuration, the first algorithm 201A comprises a probabilistic algorithm. In this respect, the person skilled in the art wishing to implement a probabilistic algorithm may consult the document Y. Kim et al., "Flipping bits in memory without accessing them: An experimental study of DRAM disturbance errors," 2014 ACM/IEEE 41st International Symposium on Computer Architecture (ISCA), Minneapolis, MN, USA, 2014, pp. 361-372, doi: 10.1109/ISCA.2014.6853210.

This document details the implementation of a probabilistic algorithm, called PARA (Probabilistic Adjacent Row Activation) intended to protect a memory from the memory row-hammering effect.

Figure 3:
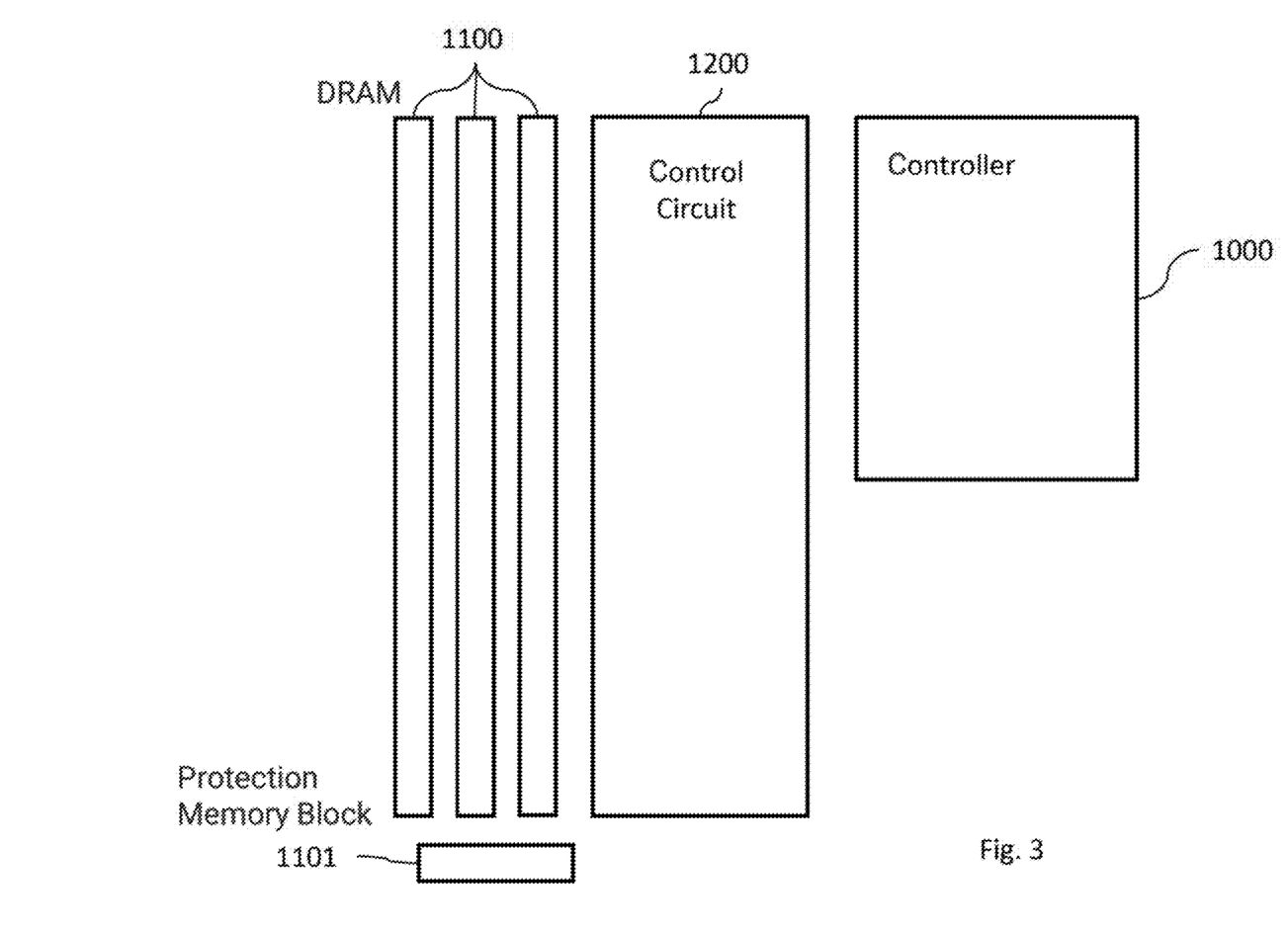
FIG. 3 is an illustration of a DRAM memory controller intended to configure a control circuit to protect said DRAM memory from row-hammering effects.

The invention also relates to a controller 1000 of DRAM memories 1100 shown in FIG. 3.

The controller 1000 is intended to configure a protection of the DRAM memories 1100 against a memory-row-hammering effect. In particular, the protection involves implementing a control circuit 1200 and a protection memory block 1101 of a predetermined capacity.

The DRAM memories, the control circuit 1200 and the protection memory block 1101 repeat most of the features stated in relation to the memory device 10.

The controller 1000 is in particular adapted to determine the total capacity of the DRAM memories 1100 controlled by the controller 1000.

In particular, if the total capacity of the DRAM memories 1100 exceeds a size, called the threshold size, beyond which the protection by an algorithm implementing a single table saved in the protection memory block 1101 is impossible, the controller divides the total capacity of the DRAM memories 1100. This occurs in particular when said table has a size greater than the storage capacity of the protection memory block.

Figure 4:
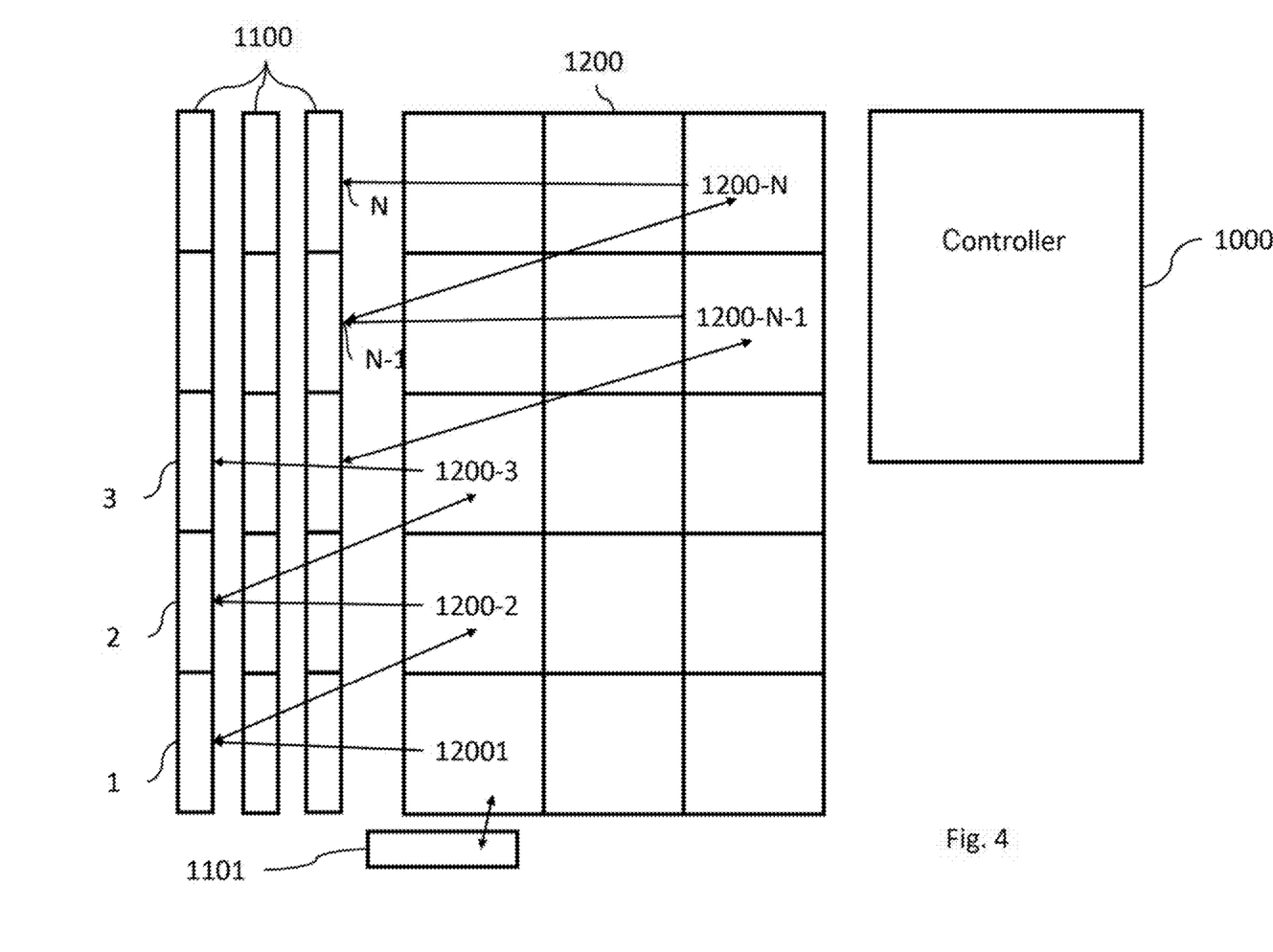
FIG. 4 is an illustration of the operating principle, and in particular of the configuration of the protection of the row-hammering effects, of the controller.

In particular, as shown in FIG. 4, the DRAM memories 1100 can be divided into N parts, with N being an integer greater than or equal to 2. Each of these parts is denoted i, for an integer i ranging from 1 to N.

Advantageously, the capacity of the parts i increases, for i ranging from 1 to N.

The controller 1000 also configures the control circuit 1200 so that it can execute N algorithms protecting against the row-hammering effect, each called algorithm 1200i for i ranging from 1 to N.

Each algorithm 1200i is in particular intended to protect the part i from the row-hammering effect by means of a table i.

Each table i, for i ranging from 2 to N, is in particular saved in the part i−1, while the table 1 is stored in the protection memory block 1101.

Conversely, if the total capacity of the DRAM memories does not exceed the threshold size, the controller 1000 configures the control circuit 1200 to protect the DRAM memories 1100 by means of a single algorithm which implements a table saved in the protection memory block 1101.

The protection memory block 1101 may advantageously comprise a memory immune to the memory row-hammering effect. In particular, the protection memory block 1101 comprises at least one of the memories chosen from: an SRAM memory, a MRAM memory, or a CNRAM memory.

Again advantageously, the protection memory block 1101 is comprised in the controller 1000.

According to another aspect, the protection memory block 1101 comprises DRAM memory, advantageously, the protection memory block 1101 forms a part 0 of the DRAM memories 1100.

Finally, the controller 1000 may comprise the control circuit 1200.

The controller 1000 as described above allows effective configuration of the control circuit 1200 in order to protect DRAM memories from row-hammering effects.

This controller in particular offers a flexible solution in terms of DRAM memory capacity.

Of course, the invention is not limited to the described embodiments and variant embodiments may be envisaged without departing from the scope of the invention as defined by the claims.

The invention claimed is:

1. A memory device (10) comprising:
   memory circuits (100), these circuits comprise memories of "DRAM" type, the total capacity of which is divided into a first part (102), called the "directly protected part", and a second part (103), called the "indirectly protected part", larger than the first part (102);
   a control circuit (200) configured to access the memory circuits, the control circuit comprises:
   a first block (201) configured to execute a first algorithm (201A) intended to protect the first part (102) from a row-hammering effect;
   a second block (202) configured to execute a second algorithm (202A) intended to protect the second part (103) from the row-hammering effect that may occur, the second algorithm (202A) using a main table stored in the first part (102).

2. The memory device according to claim 1, wherein the control circuit comprises a functional block (300) configured to execute computing functions and programs in the second part (103).

3. The device according to claim 1, wherein the first part (102) and the second part (103) are arranged so that a row-hammering effect imposed by one row of either the first part (102) or the second part (103) is not felt by the other of the first part (102) or second part (103).

4. The device according to claim 3, wherein the first part (102) and the second part (103) are configured according to one of the following configurations:
   the first part (102) and the second part (103) are disjoint so as not to share DRAM memory circuits;
   the first part (102) and the second part (103) each comprise banks of DRAM memory circuits specific to them;
   the first part (102) and the second part (103), within the same bank of DRAM memory circuits, each comprise one or more sub-banks that are specific to them, said sub-banks are then arranged so that a row-hammering effect exerted by a row of a sub-bank of the first part (102) is not felt by a sub-bank of the second part (103) and vice versa;
   the first part (102) and the second part (103) have in common a DRAM memory circuit bank, called a common bank, said common bank comprising unused memory rows and separating a section of the common bank, associated with the first part (102), from another section of the common bank, associated with the second part (103), the number of unused memory rows being chosen so that no row-hammering effect occurs between each of the two sections of the common bank.

5. The device according to claim 1, wherein the first part (102) and the second part (103) are capable of exerting a row-hammering effect on one another, and wherein the first algorithm (201A) and the second algorithm (202A) are configured to prevent the row-hammering effect of the first part (102) on the second part (103) and vice versa.

6. The device according to claim 1, wherein the second block (202) comprises a cache memory (202B) intended to store data of the main table used by the second algorithm (202A).

7. The device according to claim 1, wherein the size of the first part (102) corresponds to less than 0.1% of the size of the second part (103).

8. The device according to claim 1, wherein the first algorithm is a probabilistic algorithm.

9. The device according to claim 1, wherein said memory device (10) further comprises a protection memory block (200) wherein an initial table implemented by the first algorithm is stored, advantageously, the first block (201) also comprises a cache memory intended to store data of the initial table implemented by the first algorithm (201A).

10. The device according to claim 9, wherein the protection memory block (200) comprises a memory immune to the row-hammering effect, in particular said memory comprises at least one of the memories chosen from: a memory of SRAM type, a memory of the MRAM type, a memory of the CNRAM type.

11. The device according to claim 9, wherein the protection memory block (200) comprises a DRAM memory, and wherein the memory rows are arranged so as to prevent any row-hammering within said block.

12. A DRAM memory controller (1000), the controller being intended to configure a protection of DRAM memories against a memory row-hammering effect, the protection involving the implementation of a control circuit (1200) and a protection memory block (1101) having a predetermined capacity, the controller being adapted to:
   determine the total capacity of the DRAM memories controlled by the controller (1000);
   if the total capacity of the DRAM memories exceeds a size, referred to as the threshold size, beyond which the protection by an algorithm implementing a single table saved in the protection memory block (1101) is impossible, the controller (1000) divides the total capacity of the DRAM memories into N parts, N≥2, each part i, for i ranging from 1 to N, N and i being integer values, and configures the control circuit (1200) to execute N protection algorithms each referred to as algorithm i, for i ranging from 1 to N, each algorithm i being intended to protect the part i from the row-hammering effect by means of a table i, each table i, for i ranging from 2 to N, being saved in part i−1, while table 1 is saved in the protection memory block (1101), if the total capacity of the DRAM memories does not exceed the threshold size, the controller configures the control circuit (1200) so that it protects said DRAM memories by means of a single algorithm that implements a table stored in the protection memory block (1101).

13. The controller according to claim 12, wherein the capacity of the parts i increases for i ranging from 1 to N.

14. The controller according to claim 12 wherein the protection memory block (1101) comprises a memory immune to the memory row-hammering effect, advantageously the protection memory block (1101) comprises at least one of the memories chosen from: an SRAM memory, an MRAM memory, or a CNRAM memory.

15. The controller according to claim 14, wherein the protection memory block (1101) is comprised in the controller (1000).

16. The controller according to claim 12, wherein the protection memory block (1101) comprises DRAM memory, advantageously, the protection memory block (1101) forms a part 0 of the DRAM memories.

17. The controller according to claim 12, wherein the control circuit (1200) is comprised in the controller (1000).

* * * * *